(12) United States Patent
Tokuda et al.

(10) Patent No.: US 6,965,552 B2
(45) Date of Patent: Nov. 15, 2005

(54) MOUNTING METHOD FOR OPTICAL DEVICE AND OPTICAL HEAD EQUIPMENT

(75) Inventors: Masahide Tokuda, Ome (JP); Kimio Tatsuno, Tokyo (JP); Hirohisa Sano, Niiza (JP); Takeshi Shimano, Tokorozawa (JP); Shigeharu Kimura, Tokyo (JP)

(73) Assignees: Hitachi, Ltd., Tokyo (JP); Nichia Corporation, Tokushima (JP)

( * ) Notice: Subject to any disclaimer, the term of this patent is extended or adjusted under 35 U.S.C. 154(b) by 484 days.

(21) Appl. No.: 10/083,395

(22) Filed: Feb. 27, 2002

(65) Prior Publication Data

US 2003/0147333 A1 Aug. 7, 2003

(30) Foreign Application Priority Data

Feb. 1, 2002 (JP) ........................................ 2002-025224

(51) Int. Cl.[7] .............................................. G11B 7/125
(52) U.S. Cl. ................................... 369/121; 228/180.22
(58) Field of Search ..................... 369/121; 228/180.22, 228/180.1, 180.21, 245, 246, 254; 257/737, 738

(56) References Cited

U.S. PATENT DOCUMENTS

| | | | | |
|---|---|---|---|---|
| 5,668,822 A | * | 9/1997 | Tada | ........................... 372/36 |
| 5,986,996 A | * | 11/1999 | Kitamura et al. | ...... 369/112.16 |
| 6,028,011 A | * | 2/2000 | Takase et al. | ................ 438/745 |
| 6,281,524 B1 | * | 8/2001 | Yamamoto et al. | ........... 257/99 |
| 6,474,531 B2 | * | 11/2002 | Ozawa | ....................... 228/103 |
| 6,700,842 B1 | * | 3/2004 | Nishi | ...................... 369/44.41 |
| 6,735,230 B1 | * | 5/2004 | Tanabe et al. | ................ 372/43 |
| 6,747,939 B2 | * | 6/2004 | Saitoh et al. | ................ 369/121 |

FOREIGN PATENT DOCUMENTS

| | | | | | |
|---|---|---|---|---|---|
| JP | 04242939 A | * | 8/1992 | ......... | H01L/21/321 |
| JP | 09223846 A | * | 8/1997 | ............. | H01S/3/18 |

* cited by examiner

Primary Examiner—Brian E. Miller
Assistant Examiner—Michael V. Battaglia
(74) Attorney, Agent, or Firm—Antonelli, Terry, Stout and Kraus, LLP.

(57) ABSTRACT

A method of mounting an optical device having a step on the surface opposing to a mounting substrate favorably by face-down bonding which enables a decrease in the number of components or integrate additional components on one identical substrate and, accordingly, is useful for reducing the size and the thickness of an optical head using a light source, the method includes the step of making the volume of a solder pattern to the area ratio of each electrode different for every wiring electrode portions upon mounting the electrodes on the substrate for mounting the optical device, in which the optical device having the step can be mounted favorably to the substrate by the control for the height of solder upon melting.

23 Claims, 14 Drawing Sheets

//MOUNTING METHOD FOR OPTICAL DEVICE AND OPTICAL HEAD EQUIPMENT

BACKGROUND OF THE INVENTION

1. Field of the Invention

The present invention relates to a method of mounting an optical device having a step on an outer profile of an element on a substrate by face down bonding and a mounting structure. The present invention more particularly relates to an optical integrated module device mounting an optical device by the mounting method and the mounting structure described above and an optical device such as an integrated optical head device using the same.

2. Related Art

A nitride semiconductor laser device capable of oscillating a blue laser light at a wavelength of about 410 nm has the following constitution. That is, a nitride semiconductor material comprising InGaN as an active layer and AlGaN as a clad layer are crystallographically grown on a gallium nitride (GaN) substrate by a crystal growing method When such a blue semiconductor laser is put to practical use, the recording capacity of existent DVD apparatus using red laser light at a wavelength of about 650 nm will be increased by about four times. In view of the foregoing, sooner practical use of the blue semiconductor laser is expected. However, since no GaN substrate of a large diameter is available, crystal growth is conducted by using a sapphire ($Al_2O_3$) substrate having a lattice constant substantially identical with that of the GaN substrate. A typical example of an optical device having a step on the outer profile of the element is the GaN series semiconductor laser element. Accordingly, a P-electrode and N-electrode of a GaN series semiconductor laser formed on sapphire as an insulator are formed on one identical surface, while the P-electrode on the side of the active layer is made higher than the N-electrode, for example, by about 3 $\mu$m. For the purpose of improving the characteristic and the life of the optical device, mounting is preferably conducted by the face-down bonding. In this case, however, it is necessary to mount the device with the surface having the step on the outer profile of the element being opposed to the element mounting substrate. Accordingly, for the sake of electrically connecting the P-electrode and the N-electrode having a step on the outer profile of the element as in the existent GaN series semiconductor laser element, a mounting method different from the prior art is required. That is, in most of existent elements, the P-electrode or N-electrode can be formed on one of the surface and rear face of the outer profile of the element. Accordingly, there was no problem that occurs in the nitride semiconductor laser device formed on an insulative substrate.

FIG. 7 is a cross sectional view illustrating an example of mounting a gallium nitride series semiconductor laser element on a substrate. A laser diode chip 108 has a structure in which a gallium nitride series compound semiconductor layer 102 is laminated on the sapphire substrate 101. In the laser diode chip 108, a positive electrode 104 and a negative electrode 103 are formed on one identical surface of a crystal laminate. Then, as can be seen from FIG. 7, the outer profile of the optical device has a step, and the positive electrode 104 and the negative electrode 103 are formed on the surfaces of different levels that form the step.

On the other hand, an insulative heat sink 105 is formed with a positive electrode 106 and a negative electrode 107 being metallized on one identical surface of the heat sink. Each of the electrodes on the heat sink and each of the electrodes 104, 103 of the laser diode chip 103 corresponding to them respectively are connected with each other. Such a connection method is referred to as mounting by face down (also referred to as junction down) bonding since connection is made such that the heat sink 105 is covered not on the side of the crystal growing substrate but at the junction surface constituting the active layer of the laser diode chip 108. Reference numeral 109 denotes connection solder. Such a constitution is disclosed in, for example, Japanese Patent Laid-Open No. Hei 7-235729.

SUMMARY OF THE INVENTION

An primary object of this invention is to provide a method of mounting an optical device having a step on the surface opposing to a mounting substrate favorably by face down bonding. This invention also intends to attain reduction in the size and the thickness of an optical head device using the optical device. Technical subjects of the invention are to be detailed.

When mounting is conducted by face down bonding, the following problems are present. FIG. 8A and FIG. 8B are cross sectional views illustrating an example of a method of mounting an optical device 110 having a step on the mounting surface of an element by face down bonding in accordance with the procedures.

FIG. 8A shows a state before mounting by face down bonding. A P-electrode 111 and an N-electrode 112 of an optical device are formed on an optical device at a surface opposing to a mounting substrate, while a P-side wiring pattern 113 and an N-side pattern 114 are formed on a mounting substrate 119 at positions facing the P-electrode 111 and the N-electrode 112, respectively. Further, connection solder 115 and 116 are formed at the same height both for the P-side and the N-side.

FIG. 8B shows a state in which connection is made by melting solder. After positioning the optical device 110, a load of about 10 g is applied from above the optical device 110 and it is heated to a temperature equal to or higher than the melting point of the solder. The solders 115 and 116 are melted and the molten solder is in contact with the P-electrode 111 and the N-electrode 112 of the optical device 110. Then, by reaction of the molten solder and each of the electrodes, solder connection with the mounting substrate is completed.

However, as can be seen in FIG. 8B, the P-electrode 111 on the side of the active layer is formed on a surface at a high position from the surface opposite to the surface facing the substrate (hereinafter simply referred to as a convex portion). Accordingly, the molten solder is crushed by the application of the load through the convex portion. Then, surplus solder flows to the outside of the P-side wiring pattern 113. This state is shown by arrows in FIG. 8B. There was a worry of short-circuit between the P-electrode 113 and the N-electrode 114 by the solder 117 flowing to the N-side wiring pattern 114. FIG. 8C shows an example of forming a groove 118 for receiving the flowing solder between the wiring pattern 113 on the P-side and the wiring pattern 114 on the N-side of the mounting substrate. However, a groove forming process has to be provided additionally. Further, there is a drawback that the substrate is caused to crack at a groove-formed portion. This invention solves such a problem.

Recently, an optical disk apparatus capable of using various types of optical disks of CD, CD-ROM, CD-R, and CD-rewritable specifications at a wavelength of 780 nm and DVD, DVD-ROM, DVD-RAM specifications at a wavelength of 650 nm has been provided. In the light source for such apparatus, a light source and an optical detector are disposed separately for every semiconductor lasers of different wavelength. Further, short wavelength lasers at wavelength of blue color, purple color or shorter further improved with the recording density are expected to be used in the feature. Accordingly, it is expected that an increase in the number of parts for the optical head is inevitable. Therefore, the drawbacks concerned with the reduction of the size and the reduction of the thickness of the entire apparatus cannot be solved completely by the existent art. This invention also satisfies such a demand.

The gist of this invention is as described below. That is, a substrate having at least a first electrode and a second electrode, and an optical device having a third electrode and a fourth electrode corresponding to the first electrode and the second electrode respectively are prepared. In this optical device, the surfaces of the device for mounting the third electrode and the fourth electrode have a first height and a second height different from each other from the surface of the device on the side opposite to the surfaces on which the third and the fourth electrodes are disposed. This invention intends to favorably mount such an optical device on the substrate.

Each of the first electrode and the second electrode has at least a solder-underlying region and is connected with a conductor layer therebelow. The solder is mounted directly to the solder-underlying region. Then, the volume of the solder to be prepared is controlled before melting in accordance with the position for each of the electrodes of the optical device. In a practical measure, the area ratio of the area of the solder-underlying region to the area of the solder layer formed thereon is determined such that the ratio is different for every electrodes. The way of disposing the solder is to be described specifically later.

The corresponding electrodes of the substrate and the optical device corresponding to each other are opposed and connected electrically by melting of solder. In this case, the height and the area of the solder corresponding to at least one of the first electrode and the second electrode are controlled, and each of the electrodes of the optical device and each of the electrodes of the substrate corresponding thereto are electrically connected favorably to each other.

In this case, two cases may be considered depending on the nature of the surface of the region that is in contact with and covered with the solder. That is, there are a material having such a nature of increasing the height of the solder by the melting of the solder to higher than the initial height of the solder and a material having such a nature of decreasing the height of the solder by the melting of the solder to lower than the initial height. The material having the nature of increasing the height of the solder by the melting of the solder to higher than the initial height is the so-called less wetting material, whereas the material having the nature of decreasing the height of the solder by the melting of the solder to lower than the initial height is the so-called highly wetting material with respect to solder.

In a case where the surface of the substrate in the region in contact with and covered by the solder is formed of a material having the nature of increasing the height of the solder by melting to higher than the initial height, the area of the solder corresponding to an electrode disposed at a lower height from the surface of the optical device opposite to the surface on which the electrode disposed, for the first height and the second height at which each of the third electrode and the fourth electrode is formed, is made larger than the area of the solder-underlying region below the solder. Briefly, it is preferred to use the surface having the nature described above for the solder-underlying region of the electrode corresponding to a portion of a larger distance between the substrate and the opposing surface of the optical device among the electrode of the substrate. Then, it is preferred that the height of solder does not change greatly for the other electrode. For this purpose, it is practical that the area is made substantially identical between the area for the solder-underlying region and the area for the solder to be prepared.

On the other hand, in a case where the surface of the substrate in the region in contact with and covered by the solder is formed of a material having the nature of decreasing the height of the solder by melting lower than the initial height, the area of the solder corresponding to an electrode disposed at a position higher than the surface of the optical device opposite to the surface on which the electrode is disposed, for the first height and the second height at which each of the third electrode and the fourth electrode is formed, is made smaller than the area of the solder-underlying region below the solder. Briefly, it is preferred to use the surface having the nature described above for the solder-underlying region of the electrode corresponding to a portion of a smaller distance between the substrate and the opposing surface of the optical device among the electrode of the substrate. Then, it is preferred that the height of solder does not change greatly for the other electrode. For this purpose, it is practical that the area is made substantially identical between the area for the solder-underlying region and the area for the solder to be prepared.

The gist for the concept of this invention is as has been described above and the details for the method of providing the solder and each of the electrodes are to be explained specifically. In the following explanations. FIG. 2 through FIG. 5 are referred to while citing reference numerals in the figures for the purpose of easy understanding of the invention but they are cited merely as example. It will be apparent that this invention may adopt various other embodiments than the concrete examples described above.

Areas for solder-underlying regions (127, 128) of a first electrode and a second electrode formed on the surface of a substrate 121 for mounting a semiconductor element 120 are defined as aS1 and aS2, respectively. Volumes of solder (124, 125) disposed on the solder-underlying regions for the first electrode and the second electrode are defined as v1 and v2, respectively. In this invention, v1≠v2.

Then, the semiconductor element mounted by face down bonding on a substrate has an outer profile having the following cross section. A third electrode 122 is formed on a surface at a height ah1 from one surface 140 of the semiconductor element, while a second electrode 132 is formed on a surface at a height ah2 from the surface 140, where ah1>ah2. An area for the third electrode 122 is defined as aS3 and an area for the fourth electrode 103 is defined as aS4.

The first electrode 127 is connected with the third electrode 122, while the second electrode 128 is connected with the fourth electrode 123. It is practical that the areas for the pair of electrodes to be connected with each other are of an identical area. That is, aS1≈aS3 and aS2. The areas may of course be different from each other.

According to the mounting method of this invention, each of the values for ah1, ah2, aS1, aS2, v1 and v2 are defined such that the height for each of the opposing surfaces of the semiconductor element has a substantially constant value H relative to each of the electrode surfaces of the substrate when the semiconductor element 1 is face-mounted on the substrate. Among the six values described above, at least two values are predetermined and each of the remaining values is determined corresponding thereto. That is, each of the values is determined and prepared such that the constant height H constitutes a height that is in proportion to (ah1+v1/(aS1) or (ah2+v2/aS2). In determining each of the values, the nature of the surface of the region in contact with and covered with the solder is of course taken into consideration. While the area for the solder-underlying region is expressed as aS1 and aS2 in the foregoing explanation, they are expressed as aS'1 and aS'2 in FIGS. 4 and 5 since volumes of the solder to be prepared are different. However, in the general description, such areas of the solder-underlying regions are typically expressed as aS1 and aS2.

The solder-underlying region of the substrate comprises a multi-layered film having three layers in most cases. Preferably, a first layer is formed of titanium (Ti) or chromium (Cr), and a second layer is formed of any of platinum (Pt), molybdenum (Mo) and tungsten (W), while a third layer (uppermost layer) is formed of gold (Au) or silver (Ag). In a typical example, the solder comprises Au and Sn. A composition of the solder comprising 20% by weight to 33% by weight of Sn and the balance of Au is often used.

Silicon is used usually for the substrate. A typical example of the material with less wettability to solder on the surface of the substrate is an inorganic material such as a silicon oxide film or silicon nitride film, or an organic material such as polyimide. Further, as the material of less wettability, metal such as chromium (Cr), platinum (Pt) or molybdenum (Mo) may also be used.

Preferred embodiments in this specification are described with reference to a cross sectional view of a set of electrodes but this invention can of course be practiced, for example, in a case where there are plural regions of electrodes to be connected with solder. For example, in the example of FIG. 1, a portion of an N-electrode 123 to be connected with solder includes three separated portions, while the P-electrode 124 includes an electrode of one region. Further, each of the three separated portions may have a further different number of sub-separated regions, or the electrode may be constituted as plural separated regions in one region. Such embodiments are selected in accordance with the requirement of products to be practiced.

The optical head device according to this invention has a light source for irradiating a disk substrate with light to conduct at least one of writing and reading of information, and a driving circuit for driving the light source to output light and uses the optical device as the light source by applying the mounting method explained so far. Since the mounting method according to this invention can favorably mount also a semiconductor laser device in which plural electrodes electrically connected with plural electrodes on the mounting substrate are opposed to the substrate surface and formed at the positions of different levels, plural optical devices of different forms, for example, semiconductor lasers, photoreceiving devices, or semiconductor devices, for example, driving circuits or amplifiers can be formed by integration. The devices of different forms mean herein those having electrodes with the levels of the electrodes to be mounted on the mounting substrate relative to the substrate surface being different. Accordingly, it is required to use a mounting method different from that for the element in which electrodes are disposed on a substantially identical plane.

In this case, the light source portion of the optical head apparatus can be mounted with required components such as plural semiconductor laser devices, optical detectors for automatic focus detection and optical detectors for detecting tracking, amplifiers for amplifying signals from both of the detectors noted above or, optionally, semiconductor devices. Further, it will be apparent that desired elements can be incorporated monolithically in a case of using a semiconductor substrate for the substrate.

The thus obtained light source portion make it possible that an optical path from the light source to the disk substrate that passes the optical light source, beam splitter and objective lens is made into a single constitution in the optical head apparatus. Other practical constitutional examples are to be explained below in the column for the embodiments of the invention.

DETAILED DESCRIPTION OF THE PREFERRED EMBODIMENTS

Figure 1:
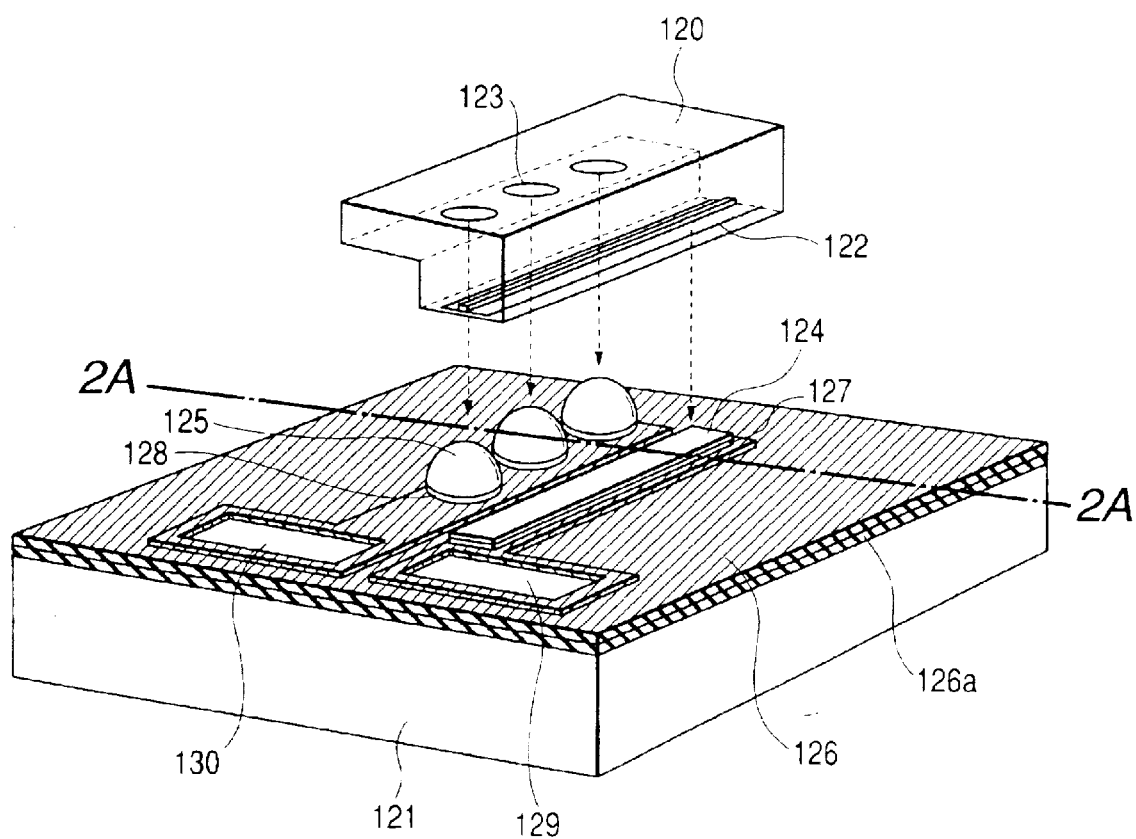
FIG. 1 is a perspective view for explaining a mounting structure for mounting an optical device having a step on a mounting surface on a substrate.

FIG. 1 is a perspective view showing an embodiment of a mounting structure according to this invention. An optical device 120 is opposed to an optical element mounting substrate 121. The optical device 120 has a step at a surface opposing to the substrate 121 for optical element mounting. A P-electrode 122 and an N-electrode 123 of the optical device are disposed on the surface at a first level and the surface at a second level, respectively, which form the step. A typical example of the optical device is, for example, a blue semiconductor laser (blue Laser Diode: hereinafter simply referred to as blue LD). Generally, in view of the restriction of the device manufacturing method, the blue LD has a structure in which the N-electrode is formed at a position lower by about 3 $\mu$m compared with the P-electrode having an active layer that emits light.

FIG. 1 shows a mounting structure in a case of mounting the blue LD 120 by face down bonding with an aim of improving the characteristics and reliability of the device. The surface on which the P-electrode 122 is mounted has a larger distance from the other surface of the device than the surface on which N-electrode 123 is mounted. The thickness of solder 124 on a mounting substrate 121 corresponding to the P-electrode 122 is 3 $\mu$m, while the thickness of solder 125 on the side of the N-electrode is 6 $\mu$m. Thus, the step of 3 $\mu$m between the P-electrode 122 and the N-electrode 123 of the blue LD 120 can be accommodated by the difference of the solder thickness and the blue LD and the substrate can be favorably electrically connected and secured.

Figure 2A:
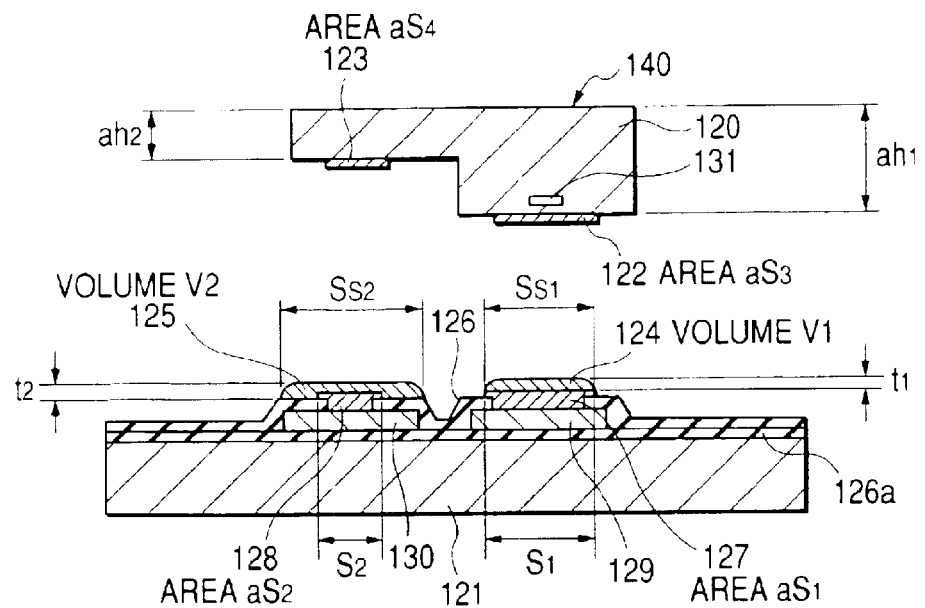
FIG. 2A is a diagram for explaining a first mounting method according to this invention for mounting an optical device having a step on the mounting surface and a substrate on a substrate.
Figure 2B:
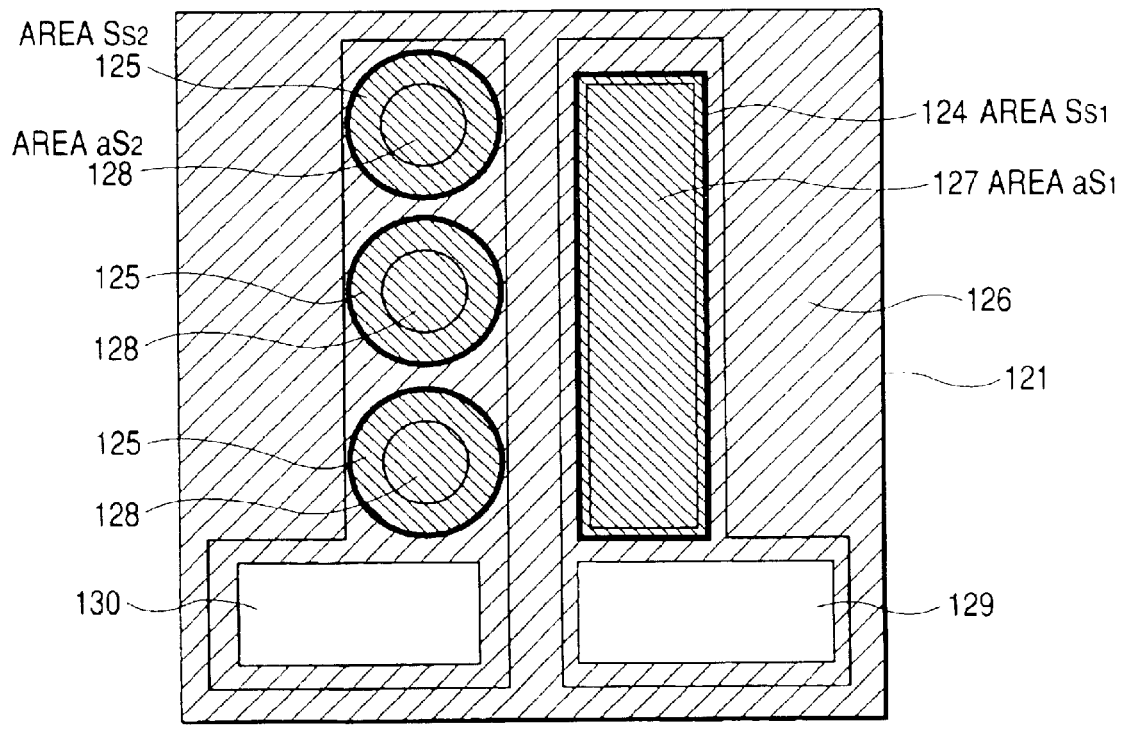
FIG. 2B is a plan view for explaining a first mounting method according to this invention for mounting an optical device having a step on the mounting surface and a substrate on a substrate.
Figure 3A:
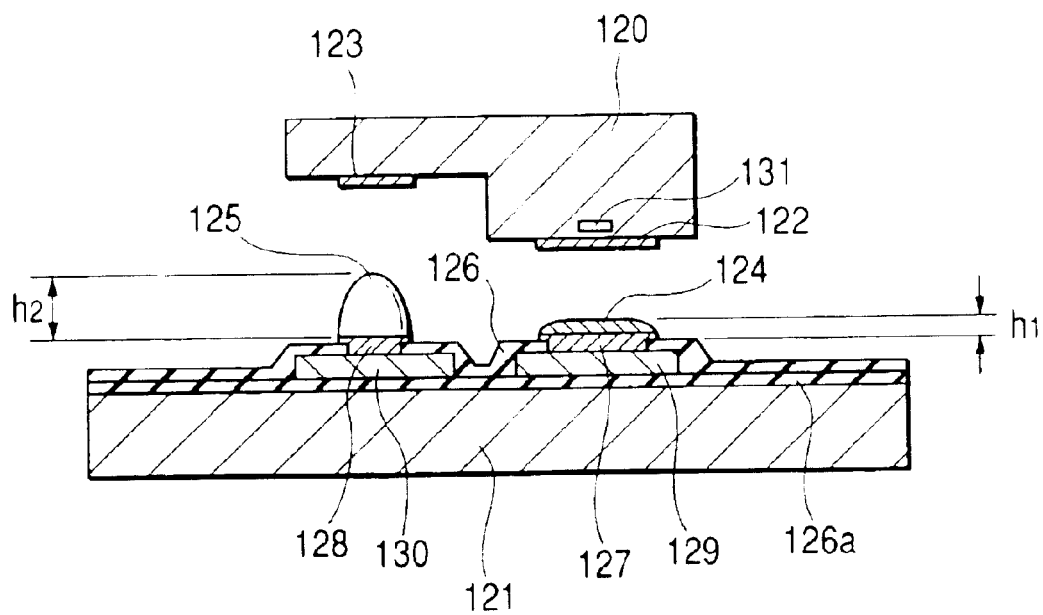
FIG. 3A is a cross sectional view showing a first mounting method of this invention for mounting an optical device having a step on the mounting surface and a substrate on a substrate in the order of manufacturing steps.
Figure 3B:
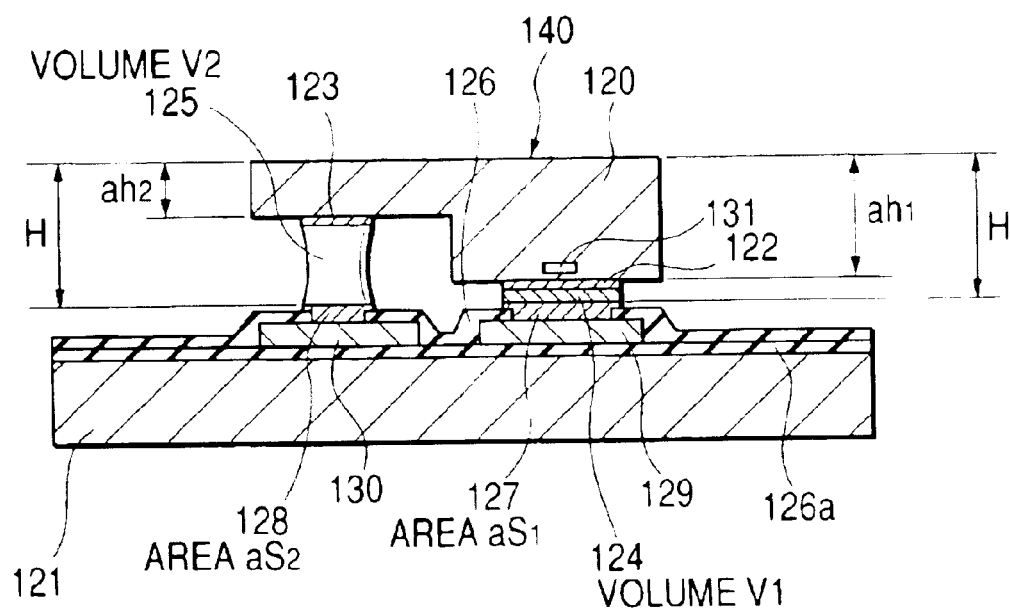
FIG. 3B is a cross sectional view showing a first mode of the invention.

FIGS. 2 and 3 are views for specifically explaining a first method of face down mounting of the LD according to this invention. FIG. 2A is a cross sectional view of a substrate and an optical device before mounting the LD. FIG. 2B is an upper plan view of the substrate. FIGS. 3A and 3B are cross sectional views succeeding to the state shown in FIG. 2 in the order of manufacturing steps.

An element mounting substrate 121 for mounting the blue LD 120 is made of silicon (Si) and a silicon oxide film 126 with less wettability to solder is formed on the surface of the substrate 121. The silicon oxide film 126 serves also an insulative protective film. Further, a solder-underlying pattern 127 for the P-side and a solder-underlying pattern 128 for the N-side are formed at positions opposing to the P-electrode 122 and the N-electrode 123 of the blue LD 120, respectively. In the figure, reference 131 denotes an active region of the optical device and reference numerals 129 and 130 denote lead ends for the respective electrodes, being connected with the solder-underlying regions. Incidentally, the connection portion thereof is not illustrated in the upper plan view.

The solder mounted on the substrate are prepared as described below. As shown in FIG. 2B, the area (aS1) for the solder-underlying metal pattern 127 for the P-side and the area (SS1) for the solder pattern 124 are made substantially identical. The thickness (t1) is 3 $\mu$m. On the other hand, on the side of the N-electrode, a solder pattern 125 is formed at an area (SS2) twice the area (aS2) of the solder-underlying metal pattern 128 for the N-side. The thickness (t2) is 3 $\mu$m.

Then, as shown in FIG. 3A, when solder is melted by heating, since the solder 124 on the side of the P-electrode has the area identical with the underlying metal pattern 127, the height of the molten solder is substantially identical with the initial solder height (h1). On the other hand, on the side of the N-electrode, since the area for the solder pattern 125 is larger than the area for the N-side underlying metal pattern 128 on the substrate 121 opposing to the electrode at a lower position from the surface of the optical device opposite to the mounting substrate, the height increases to (h2) which is higher than the initial height of the solder. This is because the molten solder 125 on the silicon oxide film ($SiO_2$) 126 made of a material with less wettability to the solder detaches from the surface of the silicon oxide film 126 and gathers on the electrode of good wettability due to the surface tension, so that it is higher (h2) than the initial height of the solder. Thus, as shown in FIG. 3B, solder connection is conducted preferably also including the electrode at a lower position from the surface of the step of the optical device opposite to the mounting substrate.

Figure 4A:
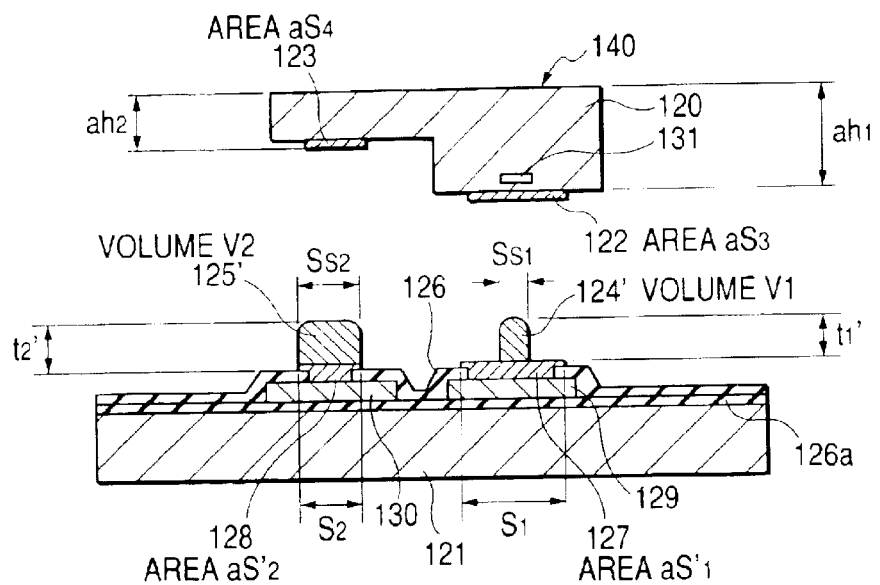
FIG. 4A is a diagram for explaining a second mounting method according to this invention for mounting an optical device having a step on the mounting surface and a substrate on a substrate.
Figure 4B:
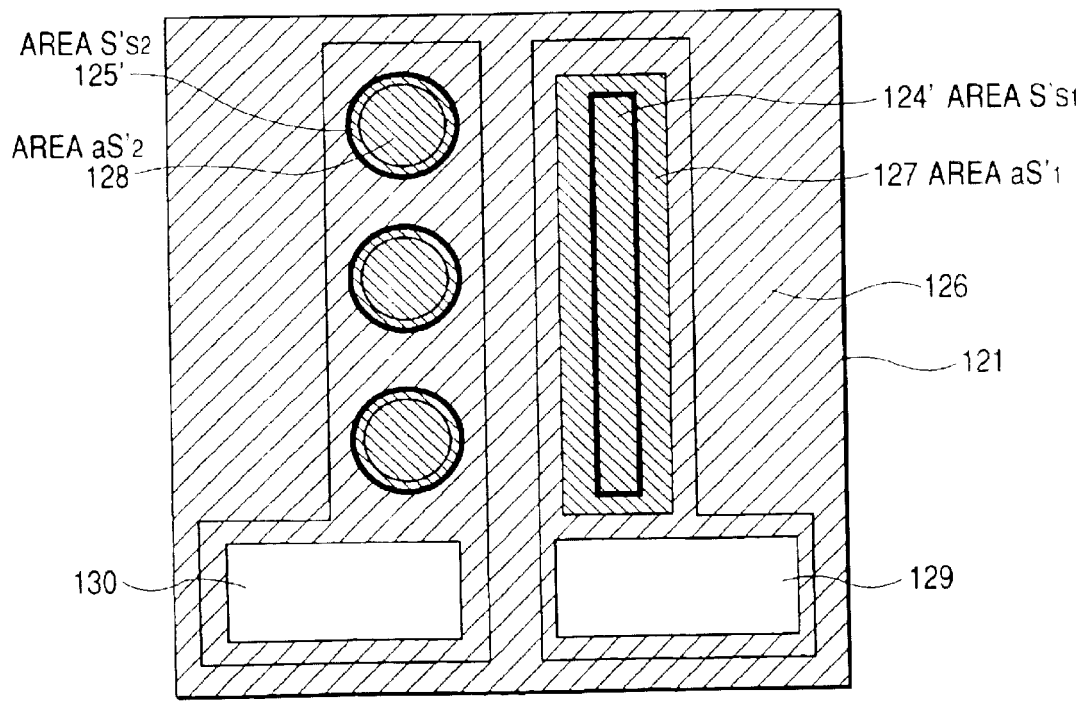
FIG. 4B is a cross sectional view showing a second mode of the invention.

FIGS. 4 and 5 show a second face down mounting method according to this invention. FIG. 4A is a cross sectional view of each of components before mounting an LD (Laser Device: hereinafter simply referred to as LD). In this LD, the P-electrode 122 of the LD 120 forms a higher region in view of one surface 140 of the crystal growing substrate, while the N-electrode 123 forms a lower region. A substrate mounting the LD 120 is made of silicon (Si) 121, and a solder-underlying pattern 127 for P-side and a solder-underlying pattern 128 for an N-side are formed at positions opposing to the P-electrode 122 and the N-electrode 123 of the LD 120. Portions identical with those in FIG. 2 carry the same reference numerals.

The method of forming solder is as described below. As shown in the plan view of FIG. 4B, a solder pattern 125'0 of an area (indicated as area (aS'2)) identical with the area (aS'2) of a solder-underlying metal pattern 128 for soldering is formed. The thickness (t'2) is 6 $\mu$m. On the other hand, a solder pattern 124' at an area (S'S1) one-half of the area (S'1)

for the solder-underlying metal pattern 127 for the P-side is formed at a thickness (t'1) of 6 μm.

Figure 5A:
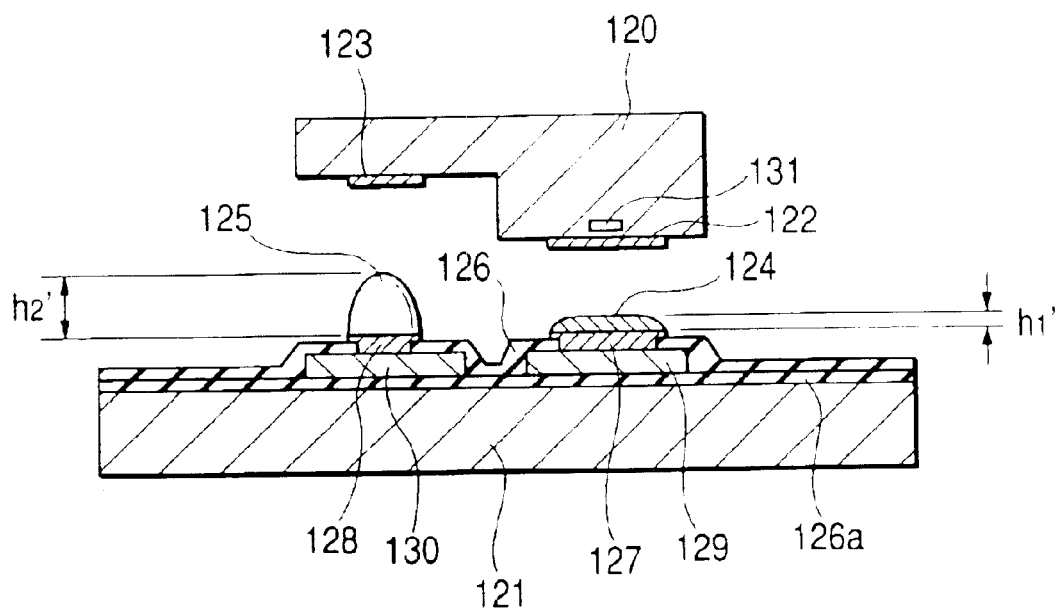
FIG. 5A is a cross sectional view showing a second mounting method of this invention for mounting an optical device having a step on the mounting surface and a substrate on a substrate in the order of manufacturing steps.
Figure 5B:
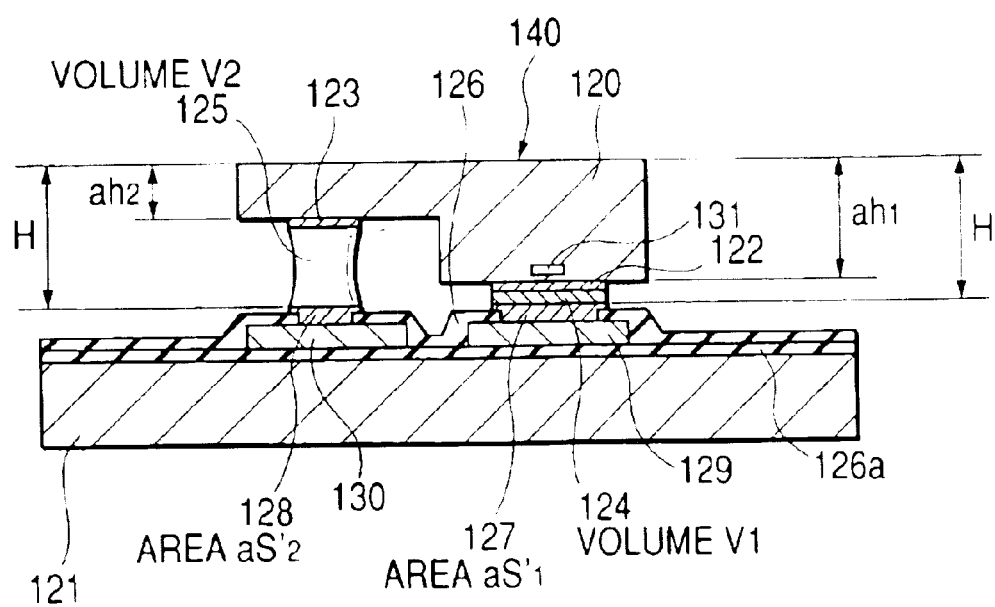
FIG. 5B is a cross sectional view showing a third mode of the invention.

Then, when the solder 124' and 125' are melted by heating, since the solder 125' on the side of the N-electrode has an area identical with that of the underlying metal pattern 128, the height of the molten solder is substantially identical with the initial solder height (h'2). On the other hand, on the P-electrode side, since the area for the solder pattern 124' is smaller than the area for the underlying metal pattern 127 on the substrate opposing to the stepped convex portion on the surface of the optical device, the height of the solder becomes lower than the height at the initial stage (h'1) (FIG. 5A). This is attained by the wetting and spreading of the molten solder on gold (Au) metal which is a material having high wettability to the solder over the gold metal. Thus, as shown in FIG. 5B, the solder is favorably connected and mounted including the step of the optical device.

Then, an example of locally forming a solder layer is shown. FIGS. 6A through 6D are cross sectional views for explaining the method of forming the pattern.

An $SiO_2$ insulative film 126a is deposited by a thickness of about 200 Å on the surface of a silicon (Si) substrate 121 by a thermal oxidation method. Then, a P-side wiring layer and an N-side wiring layer are formed on the $SiO_2$ insulative film 126a at positions opposing to the P-electrode and the N-electrode of a semiconductor laser chip to be mounted by using the usual photo-etching technique and vapor deposition process. Each of the wiring layers is a laminated film comprising, for example, a Ti layer (1000 Å thickness), a Pt layer (1000 to 2000 Å thickness) and an Au layer (about 5000 Å thickness).

Figure 6A:
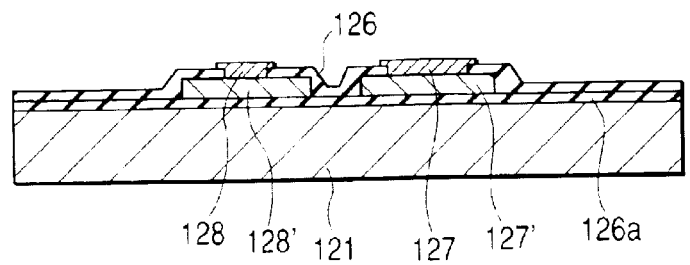
FIG. 6A is a cross sectional view showing an example of a method of locally forming solder in the order of manufacturing steps.

Further, a silicon oxide film 126 is formed by a plasma CVD process. Then, the silicon oxide film at predetermined portions of the silicon oxide film 125 is selectively removed. Metal layers 127 and 128 for solder-underlying patterns are formed covering the openings after removal. The metal layer is made of a stacked film comprising, for example, a Ti layer (1000 Å thickness), a Pt layer (1000 Å to 2000 Å thickness) and Au layer (about 2000 Å thickness). This state is shown in FIG. 6A.

Figure 6B:
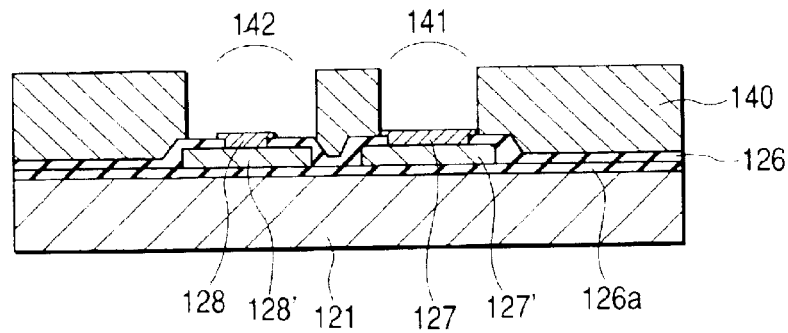
FIG. 6B is a cross sectional view showing an example of a method of locally forming solder in the order of manufacturing steps.

A resist film 140 is formed on the thus prepared substrate. Then, a window 141 of an area identical with that of the solder-underlying metal pattern 127 for the P-side is disposed in the resist film 140 by using the usual photoresist technique. On the other hand, a window 142 of an area twice the area of the solder-underlying metal pattern 128 for the N-side is formed on the side of the N-electrode (FIG. 6B).

Figure 6C:
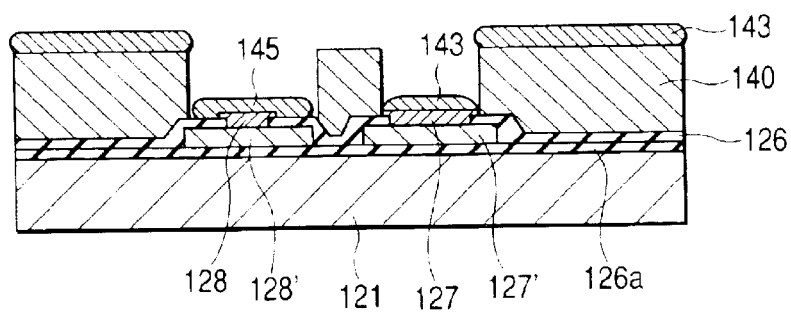
FIG. 6C is a cross sectional view showing an example of a method of locally forming solder in the order of manufacturing steps.

In the state of depositing the resist film, an AuSn solder layer 143 is deposited to a thickness of about 3 μm on the surface (FIG. 6C).

Figure 6D:
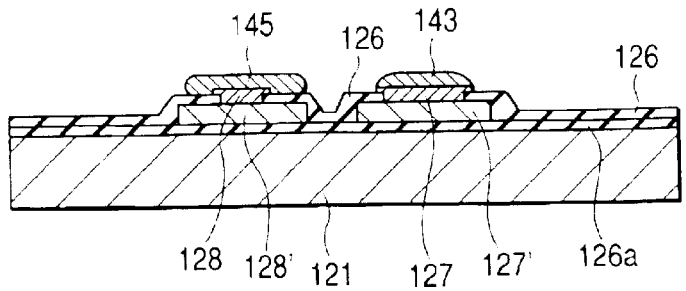
FIG. 6D is a cross sectional view showing an example of a method of locally forming solder in the order of manufacturing steps.
Figure 7:
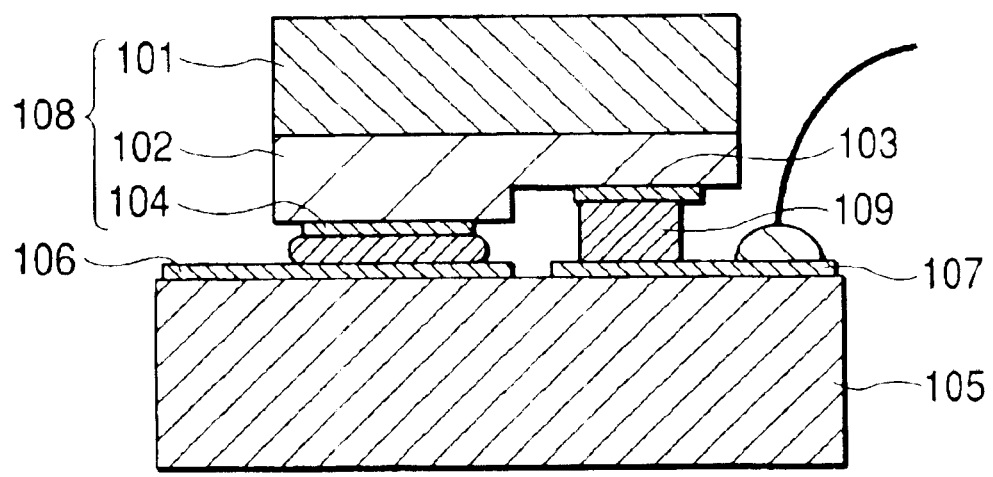
FIG. 7 is a cross sectional view showing an existent example of mounting a gallium nitride series compound semiconductor laser element on a substrate.
Figure 8A:
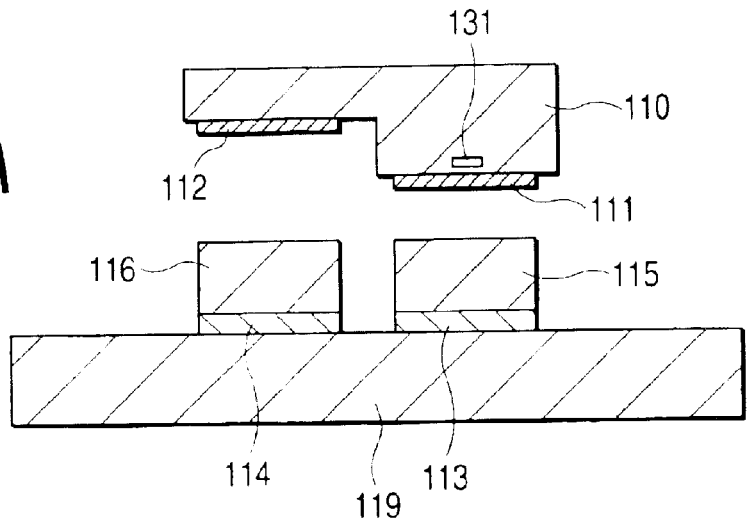
FIG. 8A is a cross sectional view for explaining a drawback in the method of mounting an optical device having a step on the mounting surface on a substrate.
Figure 8B:
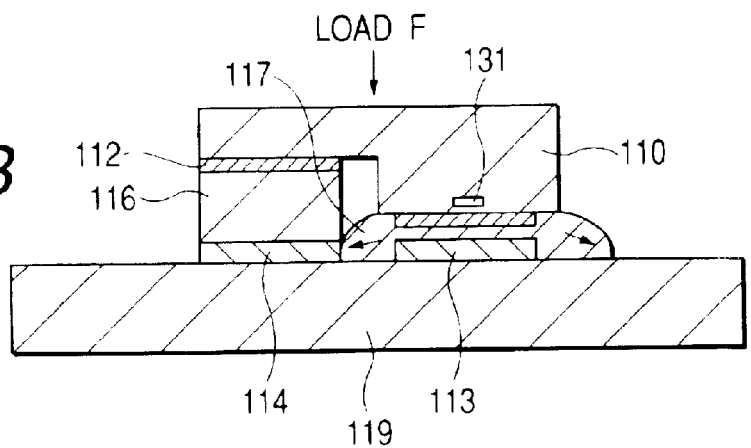
FIG. 8B is a cross sectional view for explaining a drawback in the method of mounting an optical device having a step on the mounting surface on a substrate.
Figure 8C:
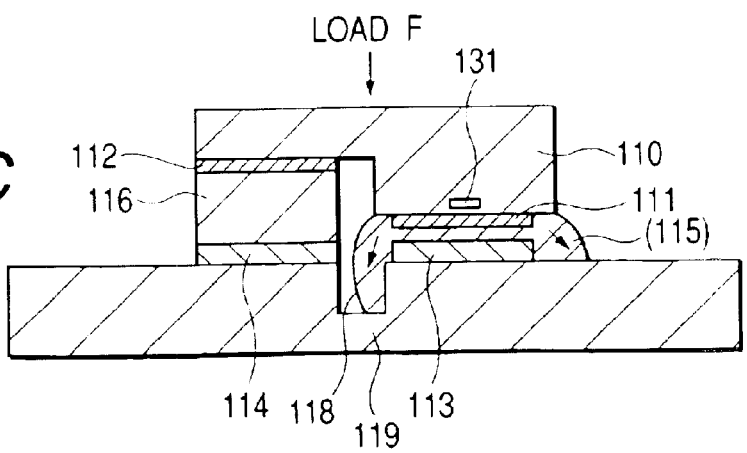
FIG. 8C is a cross sectional view for explaining a drawback in the method of mounting an optical device having a step on the mounting surface on a substrate.

Then, the specimen is immersed in an organic solvent capable of dissolving in the resist (for example, acetone), supersonic vibration is applied to the solvent to solve the resist film and form the solder layers 144 and 145 selectively (FIG. 6D). Simultaneously, the metal film on the resist film is naturally removed. This method is referred to as "lift-off method".

While only one element is shown in the figure, plural elements are usually formed in one Si wafer in the mass production. Accordingly, the Si substrate is finally cut by using a dicing saw in accordance with the pitch of patterning to manufacture optical element mounting wiring substrates 121.

For the method of depositing the metal, a description has been made of an example of using the vapor vacuum deposition method, but it will be apparent that the sputtering method, ion plating method or plating method is also applicable. Further, for the method of selectively forming the metal layer, an etching method utilizing the photoresist technology, a lift-off method, a selective plating method, as well as a selective vapor deposition method by using a metal mask or the like can be adopted.

In the foregoing explanations, the first metal layer constituting the metal patterns 127 and 128 for the solder-underlying layer is a contact layer which is used for enhancing adhesion with the $SiO_2$ insulative layer 126 deposited on the Si substrate 121. Accordingly, Cr or the like can also be used in addition to Ti for such a layer.

The second metal layer constituting the metal patterns 127 and 128 as the solder-underlying layer functions as a diffusion barrier layer for preventing inter-diffusion between the third Au layer and the first Ti layer. Accordingly, other materials than Pt, for example, Cr, Mo or W may also be used for the layers. The third metal layer constituting the metal patterns 127 and 128 as the solder-underlying layer has a role of preventing oxidation on the upper surface of the barrier layer and ensuring the wettability with the solder. Accordingly, Ag or like other material can also be used in addition to Au for such a layer.

Further, as a material with less wettability to the solder, an inorganic material such as a silicon nitride film or an organic material such as polyimide can also be used in addition to the silicon oxide film for the surface on the substrate 121. Further, as the material with less wettability to the solder, metals such as chromium (Cr), platinum (Pt) and molybdenum (Mo) may also be used.

The solder in this embodiment comprises Au and Sn but other solder may also be used. Examples of other solder can include PbSn, In and SnAg.

Figure 9:
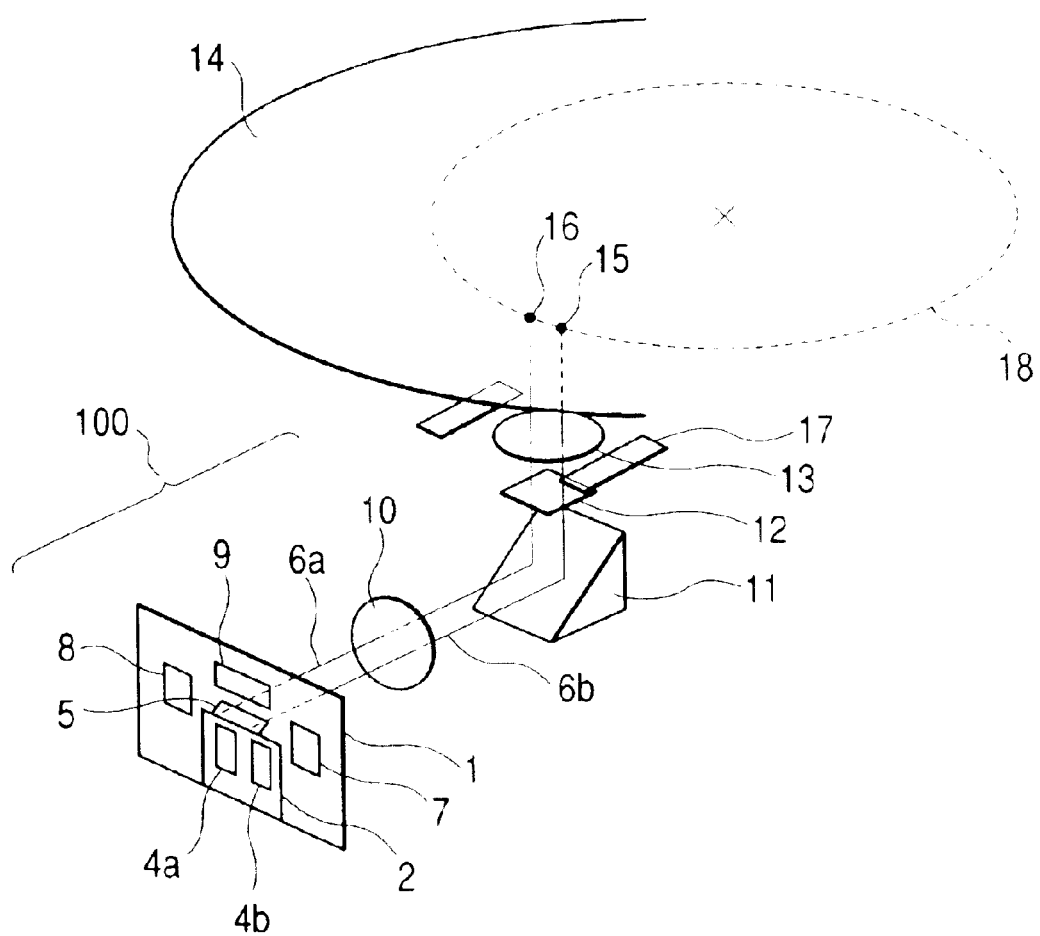
FIG. 9 is a schematic explanatory view showing an example of an optical head apparatus having a single optical path mounting an integrated light source module according to this invention.

Then, a concrete example of applying the optical device according to this invention is shown. This is an example of an optical head and FIG. 9 is a schematic explanatory diagram showing the constitution of the optical head.

In constituting a light source of the optical head, an integrated module 100 having a semiconductor laser portion, a reflection mirror 5, and optical detectors 7, 8 and 9 is prepared. The semiconductor laser portion has a structure in which a blue semiconductor laser chip 4a and a red semiconductor laser chip 4b are mounted on a semiconductor substrate 1. In the figure, reference numeral 2 denotes an attaching surface of the laser chip. The blue semiconductor laser chip 4a has an outer profile explained so far. That is, it has both of a P-electrode and an N-electrode on the surface for mounting on the substrate and both of the electrodes are formed with surfaces at two levels respectively on the crystal growing substrate. On the other hand, the red semiconductor laser chip 4b has a structure in which electrodes are led out from the surface and the rear face of the chip. When the blue semiconductor laser chip 4a is mounted on the substrate 1, the mounting method according to this invention is adopted. The concrete structure thereof can adopt any of the embodiments explained so far. Accordingly, a detailed explanation of the mounting method is to be omitted.

Blue and red laser light emitted from the integrated module 100 form beams 6a and 6b, respectively, which are arranged into parallel light through a collimator lens 10. Then, they pass through an upwarding mirror 11, a diffraction grating plate 12 and reach an objective lens 13. The laser light is applied by way of the objective lens 13 as spots 15, 16 onto the surface of an optical disk 14. Depending on the semiconductor laser wavelength, the objective lens 13 comprises plural members, or a single member capable of collecting light of plural wavelength. The lens is focused on a recording surface by an actuator 17 in accordance with the motion along with the rotation of the optical disk and conducts tracking, that is, follows the recording track 18 on the surface of the disk. Thus, signals are recorded as a row of pits on the optical disk in accordance with the driving state, that is, the ON-OFF state of the semiconductor laser, or the signals are used for reading already recorded pits.

As described above, when plural semiconductor lasers are integrated in the integrated module 100, the collimator lens 10, the objective lens 13 and the upwarding mirror 11, etc. are arranged in one piece to make the optical paths of the optical head into a single constitution.

In other words, the following optical apparatus can be realized by using this optical head. The example can include, for example, (1) those capable of recording and reproducing DVD of 1.2 mm in thickness by a semiconductor laser 4b at a wavelength of 650 nm or (2) those capable of recording and reproducing DVD-RAM super DVD of 0.6 mm in thickness by a semiconductor laser 4a at a wavelength of 410 nm.

As described above, this invention provides a breakthrough for reducing the size and the thickness of the entire driver apparatus capable of recording and reproducing various types of optical disks. Various types of semiconductor lasers of different wavelengths and optical detectors corresponding to such different wavelengths are positioned at an order of mask accuracy and plural semiconductor lasers are hybridized and integrated so as to reduce the number of components comparable with that of monolithic. Then, plural optical paths in existent optical heads can be reduced into a single optical path.

Figure 10A:
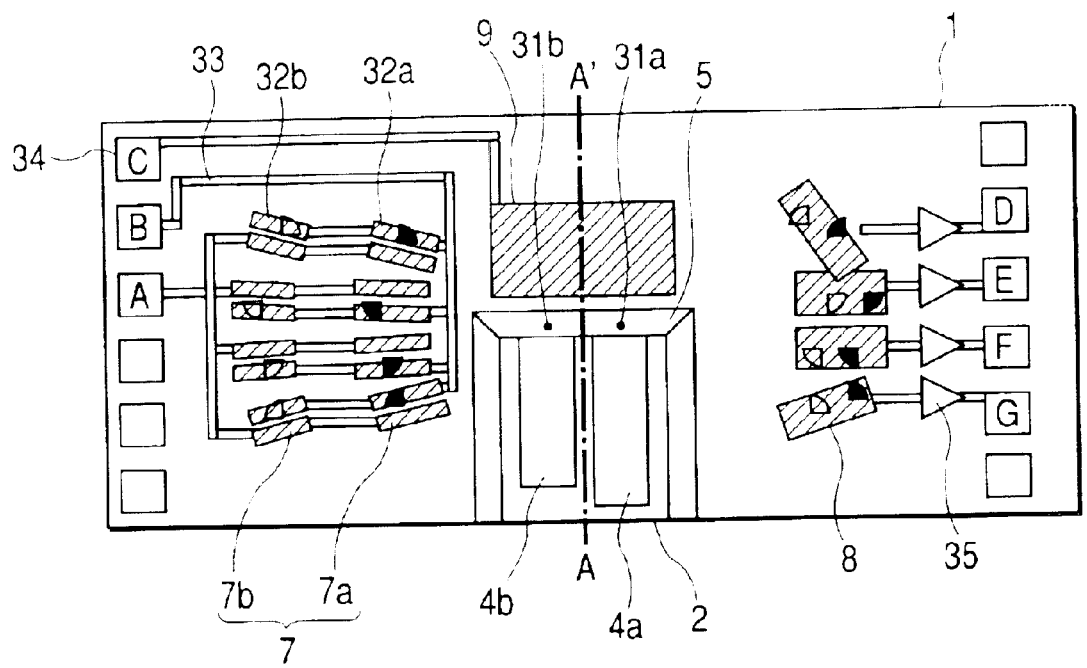
FIG. 10A is a plan view for explaining a structure of a light source according to this invention.

Then, an example of the constitution of a DVD integrated substrate is to be explained. FIG. 10A specifically shows the surface of the semiconductor substrate 1 as viewed from the side of the collimate lens 10. Eight solid quadrants shown by reference numeral 32a each denotes a laser beam at a wavelength of λa separated by the diffraction grating 23, while eight bland quadrants shown by reference numeral 32b correspond to laser beams at a wavelength of λb separated by the diffraction grating 12. Optical detector elements for obtaining out-of-focus detection signal are indicated by reference numeral 7. The region 7 comprises eight rectangular optical detector elements 7a for receiving laser beams 32a at a wavelength of λa and eight rectangular optical detector elements 7b for receiving laser beams 32b at a wavelength λb. The out-of-focus detection method employs a knife edge method or Foucault's method by quadrant beam and when they are wired by a conductive thin film 33 as shown in FIG. 10A, a differential signal can be obtained from a terminal A and terminal B of the wire bonding pad 34. The conductive thin film 33 comprises a Ti/Pt/Au laminate or Al for instance.

Reference numeral 8 denotes optical detector elements for obtaining track deviation detection signal and information reproducing signal. In the optical detector elements, output signals from four optical detector elements 8 are allowed to pass through amplifiers 35 formed on the semiconductor substrate and outputted from the terminal D, the terminal E, the terminal F and terminal G of the pad 34. Reference numeral 9 denotes an optical detector element for monitoring the amount of light emitted from the semiconductor laser chips 4a and 4b. The output signal from the optical detector element 9 is outputted from the terminal C of the pad 34. Points 31a and 31b show the reflection positions of the laser beams 6a and 6b emitted from the semiconductor laser chips 4a and 4b on the surface of the semiconductor mirror 5. When the emission point distance D between the semiconductor laser chips 4a and 4b as the distance between the points 31a and 31b is defined substantially as: $D \approx fc \times (\lambda b - \lambda a)/P$, the light collection position for the laser beam at the wavelength λa and the light collection position for the laser beam at the wavelength λb are allowed to substantially coincide with each other. In this way, the optical detector elements and amplifiers can be used in common for the beams of different wavelength, which can economize the surface of the semiconductor substrate 1, and additionally the number of wire bonding pads and output wires can be reduced. Accordingly, it has also an effect of reducing the size of the package for containing the semiconductor substrate 1.

Figure 10B:
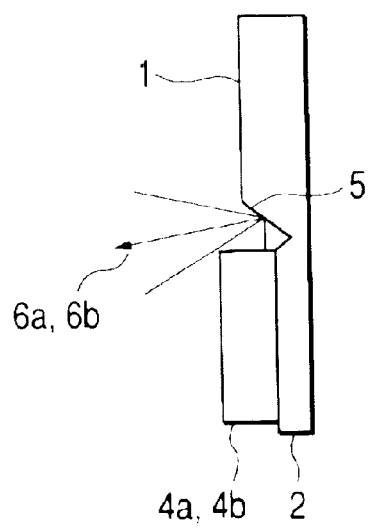
FIG. 10B is a cross sectional view of the semiconductor substrate taken along broken line A–A' in FIG. 10A.

FIG. 10B shows a cross sectional structure of the semiconductor substrate 1 taken along broken line A–A' in FIG. 10A. The semiconductor mirror 5 is formed preferably at an angle of 45° relative to the laser chip attaching surface 2. The fabrication is attained sufficiently by the so-called anisotropic etching. The anisotropic etching utilizes a phenomenon, for example, in the fabrication of a mirror face for the silicon substrate that when the silicon (100) face is etched with an aqueous potassium hydroxide solution, a concave of frustum of pyramid having a flat (111) face as a slope is formed since the etching rate for the (111) face is slower by about two digits relative to (100) face. In this case, the angle of (111) face relative to (100) face of the silicon crystal is about 54.7°. Accordingly, in order to form a semiconductor mirror at 45°, it is necessary to use a silicon substrate at an off angle of about 9.7° with the crystallographic axis being slanted relative to the surface. However, it is necessary that the off angle is determined also considering the adaptability of the semiconductor process for forming the optical detector element or electronic circuit, and the semiconductor mirror 5 is sometimes offset from 45° and the emitting direction of the laser beam 6a or 6b may sometimes be offset from the vertical direction of the semiconductor substrate 1.

Figure 11:
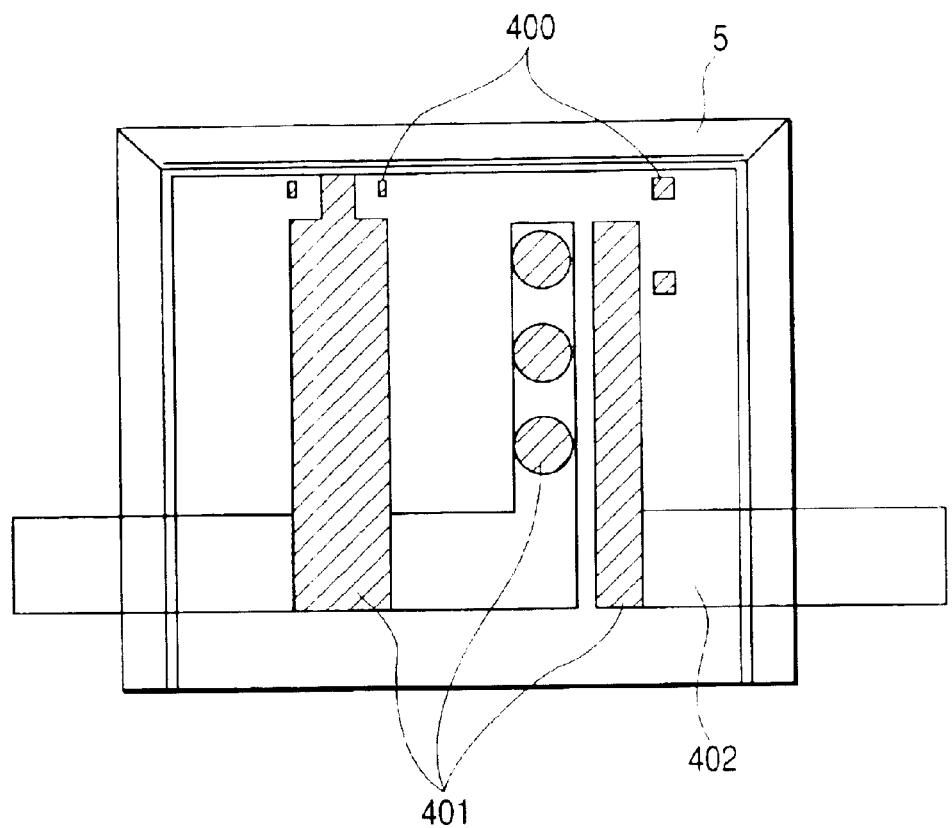
FIG. 11 is a diagram showing an example of a substrate of an integrated light source, a positioning index, a solder pattern and electrodes according to this invention.
Figure 12:
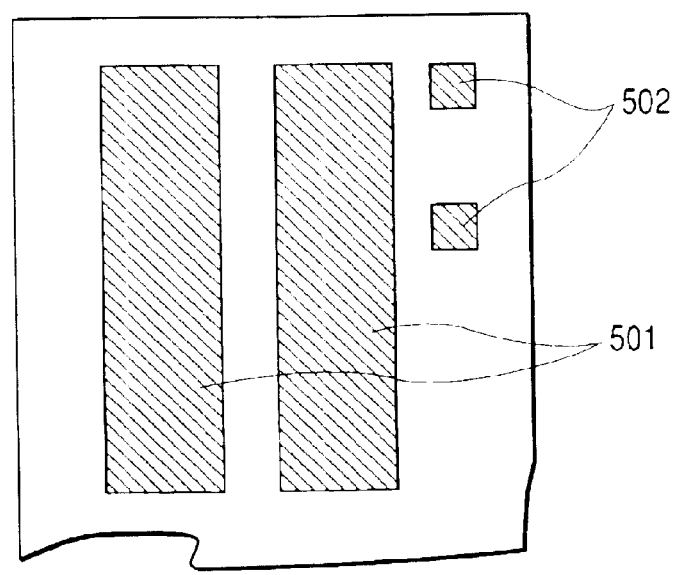
FIG. 12 is a diagram showing an example of an index pattern for positioning provided for a semiconductor laser.
Figure 13:
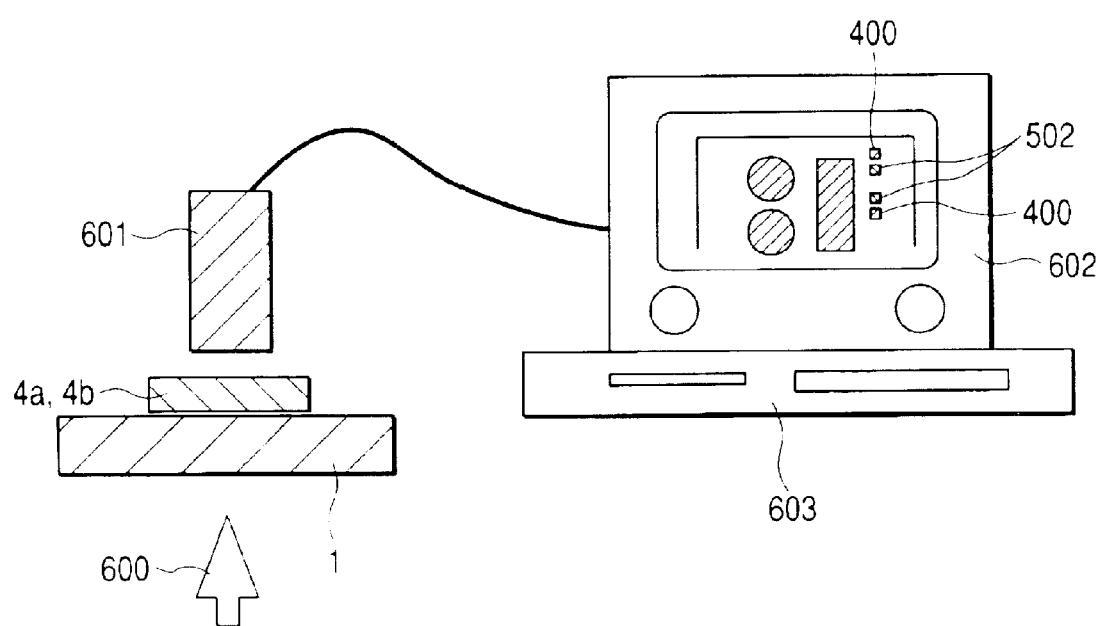
FIG. 13 is a diagram showing a method of positioning a semiconductor laser light source with an index and an integrating substrate with a corresponding index pattern.

Then, a method of mounting plural semiconductor lasers with high accuracy on a silicon conductor substrate is to be explained. FIGS. 11, 12 and 13 are views for explaining the mode of aligning optical elements to the integrating substrate.

In a first example, positioning is conducted by attaching positioning index marks on both of a silicon substrate formed with an optical detector and a semiconductor laser, performing the irradiation of visible light or infrared light, focusing the images thereof on an opto-electronic conversion surface, for example, of CCD, which are input into a computer and calculating the center of gravity for each of the marks. In view of the calculation for the center of gravity, the positioning accuracy can be attained at the order of sub-micron. Further, plural semiconductors and monolithically integrated silicon can be hybridized and integrated with higher positional accuracy by index marks.

FIG. 11 is a plan view showing a state in which index patterns 400 are attached to a silicon substrate 1. Reference numeral 401 denotes a solder pattern, on which a semiconductor laser is solder bonded. An electrode pattern 402 is formed in connection with the electrode pattern 402. On the other hand, FIG. 12 shows a solder pattern 501 and a positioning index pattern 502 formed on the rear face of corresponding semiconductor lasers 4a and 4b.

FIG. 13 explains a method of positioning an index pattern 400 on a substrate 102 and an index pattern 502 on a rear face of semiconductor lasers 4a and 4b. The outline of the method is as described below. That is, the substrate 1 and the semiconductor laser 4a (or 4b) are irradiated from the surface or the rear face with infrared rays 600, the reflected light or transmission light is received by a microscope 601 and the index pattern attached there is enlarged and projected on a video monitor 602. Then, the center position for each of the index patterns 400 and 502 is calculated by a computer 603 and the substrate 1 or the semiconductor laser is moved slightly till the positional displacement of two centers is reduced to zero. When the positioning is completed, they are applied with tact bonding and treated in a reflow furnace to complete solder bonding.

The mode of forming the reflection mirror on the silicon substrate formed with the optical detector is highly practical. That is, this comprises providing an off substrate at about 9.7° and forming a reflection mirror at an angle of about 45° by anisotropic etching of silicon, for reflecting the beam from the semiconductor laser on the mirror and deflecting the beam substantially at an normal angle relative to the surface of the silicon substrate.

Figure 14:
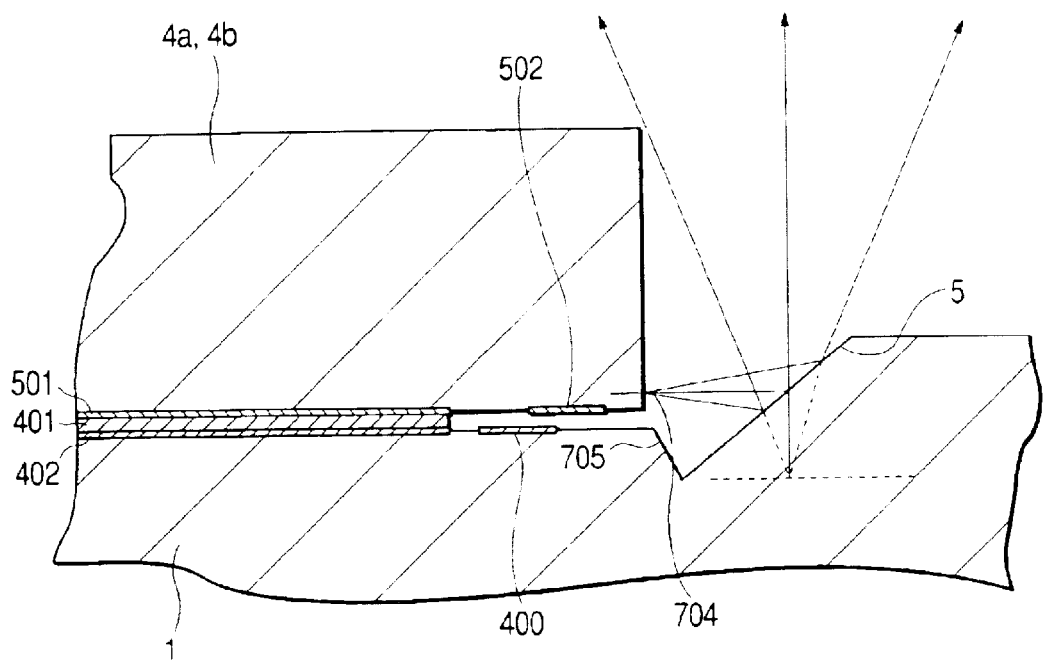
FIG. 14 is a cross sectional view taken along line A–A' in FIG. 10A.
Figure 15:
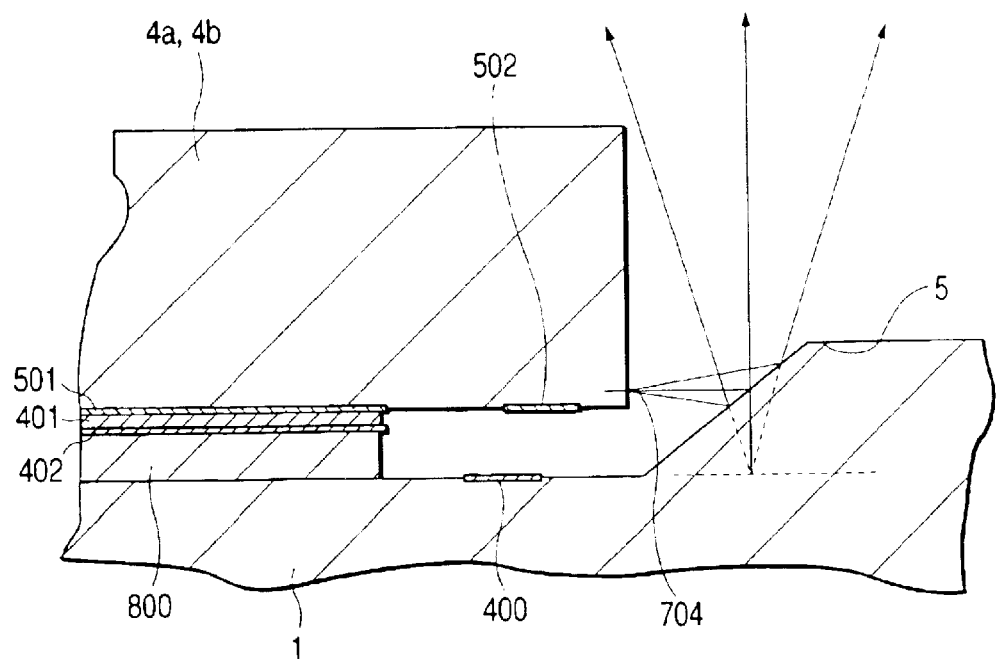
FIG. 15 is a cross sectional view showing an example of an integrating substrate provided with a layer for promoting heat dissipation from a semiconductor laser light source.

FIGS. 14 and 15 show examples of adding a structure for heat dissipation or stress relaxation of an integrating substrate. FIG. 14 is a cross sectional view in a case of solder mounting semiconductor lasers 4a and 4b on a substrate 1 with a mirror. This is a cross section taken along line A–A' in FIG. 10A. In this example, a mirror 5 is formed being integrated with a silicon substrate for instance. An electrode 700 and a positioning index pattern 502 are formed at the rear face of a semiconductor laser and they are soldered on the substrate 1 formed with an electrode 701 and solder 702. Positioning for the semiconductor laser and the substrate are conducted between the index patterns 502 and 703. Beams from the semiconductor lasers 4a and 4b are emitted from a light emission point 704, reflected at the mirror 5 and then reaches a beam splitter, an objective lens and then an optical disk. A base 750 is formed on the substrate 102 so that the beam from the light emission point 704 is not interfered at the bottom of the substrate.

Further, it is useful to monolithically form an amplifier for electrically amplifying a photocurrent generated from an optical detector on the silicon substrate formed with the optical detector and interpose a high thermal conductive material between the semiconductor laser and the silicon substrate with an aim of widely diffusing heat generated from the semiconductor laser upon soldering the semiconductor laser onto the silicon substrate attached with an oblique mirror and positioning index marks.

Further, it is also practically useful to monolithically form an amplifier for electrically amplifying photocurrent generated by the optical detector on the silicon substrate formed with the optical detector and interpose a material having a stress relaxation effect between the semiconductor laser and the silicon substrate for relaxing the stresses caused by difference of heat expansion efficients between them upon soldering the semiconductor laser on the silicon substrate attached with the oblique mirror and the positioning index mark.

FIG. 15 is an example of interposing a high thermal conductivity material 800 in a layerous manner just below the semiconductor laser in order to improve the heat dissipation. This dissipates the heat generated from the active layer of the semiconductor laser just therebelow, to conduct heat through a larger area thereby lowering the heat resistance as far as the heat sink. Further, the layer 800 shown in the figure can be provided with a function of relaxing stresses generated due to the difference of the heat expansion coefficients between the semiconductor laser and the semiconductor substrate.

Figure 16:
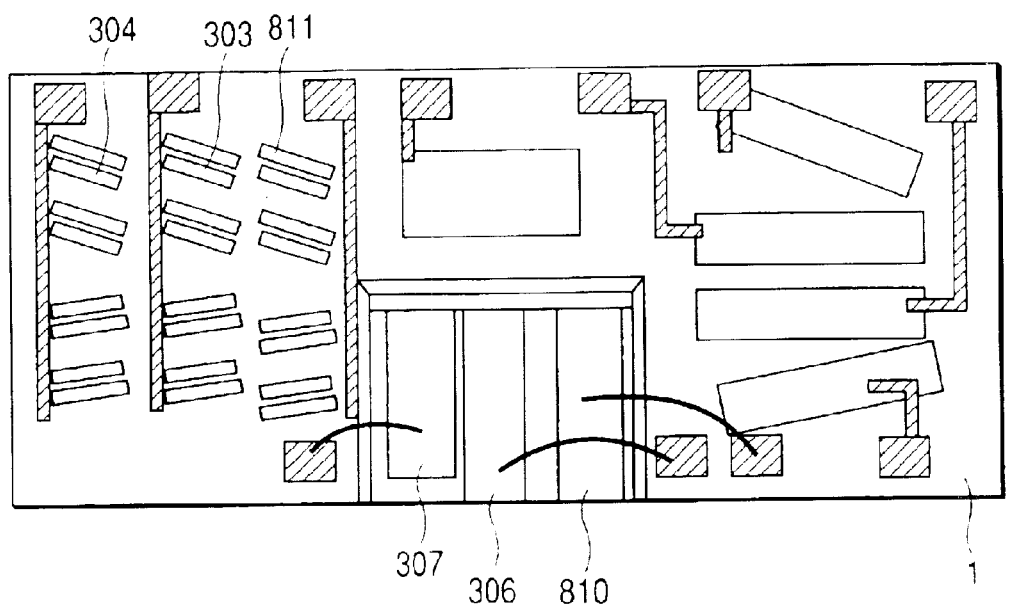
FIG. 16 is a plan view showing an example of mounting three kinds of semiconductor laser light sources on an integrating substrate according to this invention.

FIG. 16 is a plan view showing an example in which in a multi-wavelength module three semiconductor lasers, for example, of blue color, red color and infrared light are mounted in an arranged manner. Since the basic constitution is identical with that in FIG. 9, only the portion for the semiconductor laser is to be explained. Such semiconductor lasers are a blue/purple semiconductor laser 810 at a wavelength near 410 nm, a red laser 306 of a wavelength near 650 nm and an infrared laser 307 of a wavelength near 780 nm as viewed from right on the drawing. Optical detectors 304, 303 and 811 corresponding to them respectively are formed each by three sets for tracking. Thus, this example shows a case where one set is used for tracking and reproducing signals in common. The three kinds of wavelength correspond to recording and reproducing optical disks for super DVD, DVD and CD for which standardization has now been under progress.

A mode of monolithically forming an amplifier for electrically amplifying a photocurrent generated from an optical detector on a silicon substrate formed with an optical detector and incorporating an oblique mirror and positioning index marks is also practical.

Figure 17:
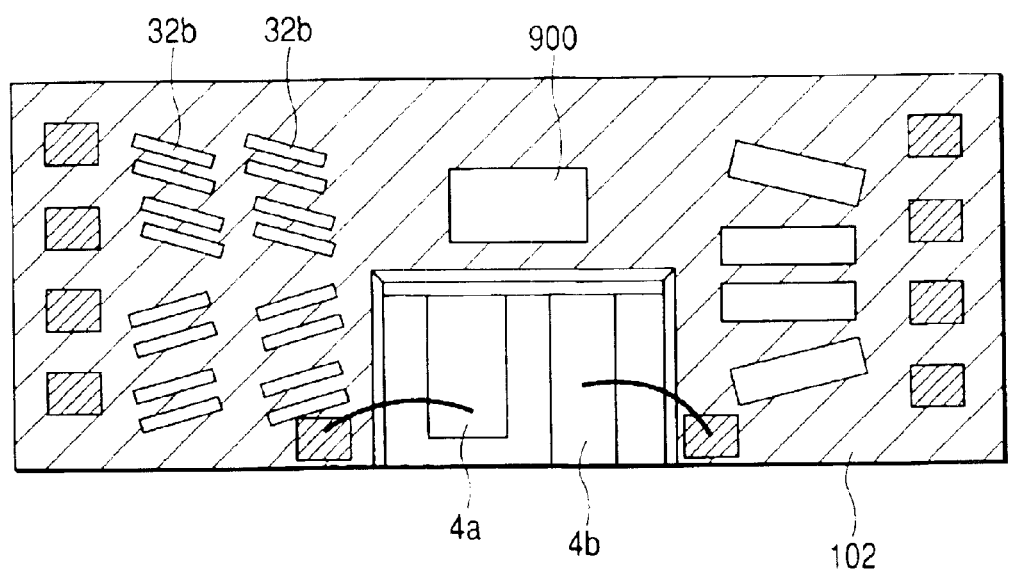
FIG. 17 is a plan view showing an example of monolithically integrating amplifiers and optical detectors on an integrating substrate according to this invention.

FIG. 17 is a plan view of an integrated module according to another embodiment of this invention. This is an example of monolithically integrating a photo-receiving element and an amplifier to one identical substrate. That is, an amplifier 900 for amplifying a photocurrent from optical detectors 32a and 32b is monolithically formed on a silicon or GaN substrate 102. Thus, the degree of integration can be improved by the decrease in the number of components. As such an example, it will be apparent that other OEIC (Optoelectric Integrated Circuit) can be mounted also optionally.

According to this invention, face down mounting of a blue LD chip comprising a gallium nitride series compound semiconductor and having a step on the mounting surface can be realized. Accordingly, it is possible to provide an optical disk apparatus for recording and reproducing use in super DVD, DVD and CD by multi-wavelength integrated module having an optical source of multiple wavelengths including a blue LD.

The mounting method according to this invention allows an optical device having a step disposed on a mounting surface to be favorably mounted on a desired mounting substrate.

Further, the optical head device according to this invention is capable of decreasing the number of components, thereby reducing the size and thickness of the optical head device extremely usefully.

References numerals are as follows: 110, 120: optical device, 121: substrate, 111, 122: P-electrode of LD, 112, 123: N-electrode of LD, 113: P-wiring of substrate, 114: N-side wiring of substrate, 124, 130, 130': P-side solder of substrate, 125, 129, 129': N-side solder of substrate, 126: insulating film, 127: P-side solder-underlying metal of substrate, 128: N-side solder-underlying metal of substrate, 140: resist, 1: semiconductor substrate, 2: semiconductor laser mounting surface , 4a, 4b: semiconductor laser, 5: reflection mirror, 6a, b: beam from semiconductor laser, 7: optical detector , 8: optical detector, 9: optical monitoring detector, 10: collimator lens, 11: upwarding mirror, 12: composite element of diffraction grating and wavelength plate, 13: objective lens, 14: light disk, 15, 16: light spot , 17:

actuator, 18: track, 22: diffraction grating, 23: diffraction grating, 24: quadrant wavelength plate, 1a, 1b: spot on mirror, 32a, 2b: auto-focusing detecting light spot, 33-wiring, 34: electrode pad, 35: amplifier, 00: package base, 201: conduction pin, 203: cap, 204: window, 41: case, 42: lead frame, 43: base, 44: window, 45: reflective film, 400: index mark, 401: solder pattern, 402: electrode pattern, 01: semiconductor laser electrode pattern, 502: semiconductor laser index mark, 00: infrared ray, 601: infrared ray camera, 602: monitor, 603: computer, 704: emission point of semiconductor laser, 705: base, 800: high heat conductive material or stress relaxing material, 810: blue-purple semiconductor laser, 32C: optical detector, 900: OEIC substrate with amplifier

What is claimed is:

1. A method of mounting an optical device comprising the steps of:
    preparing a substrate in which at least a first electrode and a second electrode are disposed and an optical device in which a third electrode and a fourth electrode are disposed corresponding to the first electrode and the second electrode respectively, in which
    surfaces for mounting the third electrode and the fourth electrode of the optical device have a first height (ah1) and a second height (ah2) from one surface of the optical device on the side opposite to the surface for mounting the third electrode and the fourth electrode, respectively, where ah1>ah2,
    each of the first electrode and the second electrode has at least a solder-underlying region and solder on the solder-underlying region, and
    the solder-underlying region area of the first electrode is aS1, the solder-underlying region area of the second electrode is aS2, the third electrode area is aS3, the fourth electrode area is aS4, the volume of a solder disposed on the solder-underlying region of the first electrode is v1, and the volume of a solder disposed on the solder-underlying region of the second electrode is v2, v1≠v2, and
    each of the values of ah1, v1, aS1, ah2, v2 and aS2 is set so that the height of the first electrode and the second electrode from the surface of the solder-underlying region to the one surface of the optical device is a height in proportion to (ah1+v1/aS1) or (ah2+v2/aS2) after the solder has been melted; and
    positioning the substrate and the optical device so that the third electrode of the optical device is disposed on the first electrode of the substrate and the fourth electrode of the optical device is disposed on the second electrode of the substrate, melting the solder and soldering the optical device to the substrate.

2. A mounting method of an optical device according to claim 1, wherein the volume (v1, v2) of the solder formed corresponding to each of the first electrode and the second electrode disposed on the substrate is prepared such that the value (v1/aS1, v2/aS2) obtained by dividing the volume (v1, v2) by each of the areas (aS1, aS2) of the solder-underlying region of the first electrode and the second electrode on the substrate has a relation of v2/aS2>v1/aS1.

3. A mounting method of an optical device according to claim 2, wherein the surface of the second electrode of the substrate that is in contact with and covered with the solder has a region of material having a nature of increasing the height of solder to higher than the initial height by the melting of the solder, and the area of the solder prepared for the second electrode is larger than the area of the solder-underlying region below the solder, in the preparation step.

4. A mounting method of an optical device according to claim 3, wherein the surface of the substrate in a region in contact with and covered with the solder is formed with at least one member selected from the group consisting of silicon oxide film, silicon nitride film, polyimide type organic polymer resin, chromium (Cr), platinum (Pt), molybdenum (Mo), and tungsten (W).

5. A mounting method of an optical device according to claim 2, wherein the surface of the first electrode of the substrate that is in contact with and covered by the solder has a region of a material having a nature of decreasing the height of solder to lower than the initial height by the melting of the solder, and the area of the solder prepared for the first electrode is formed smaller than the area of the solder-underlying region below the solder, in the preparation step.

6. A mounting method of an optical device according to claim 2, wherein the solder-underlying region has a solder underlying layer and a conductor layer disposed below the solder underlying layer and has the solder layer on the solder underlying layer.

7. A mounting method of an optical device according to claim 1, wherein the surface of the first electrode of the substrate that is in contact with and covered with the solder has a region of material having a nature of decreasing the height of solder to lower than the initial height by the melting of the solder, and the area of the solder prepared for the first electrode is formed smeller than the area of the solder-underlying region below the solder, in the preparation step.

8. A mounting method of an optical device according to claim 1, wherein the solder-underlying region has a solder underlying layer and a conductor layer disposed below the solder underlying layer and has the solder layer on the solder underlying layer.

9. A mounting method of an optical device according to claim 1, wherein both of (ah1+v1/aS1) and (ah2+vS2/aS2) provide a substantially constant value for the height of the first electrode and the second electrode from the surface of the solder-underlying region to the one surface of the optical device after the solder has been melted.

10. A mounting method of an optical device
    preparing a substrate in which at least a first electrode and a second electrode are disposed and an optical device in which a third electrode and a fourth electrode are disposed corresponding to the first electrode and the second electrode respectively, in which
    surfaces for mounting the third electrode and the fourth electrode of the optical device have a first height (ah1) and a second height (ah2) from one surface of the optical device on the side opposite to the surface for mounting the third electrode and the fourth electrode, respectively, where ah1>ah2,
    each of the first electrode and the second electrode has at least a solder-underlying region and solder on the solder-underlying region, and
    the solder-underlying region area of the first electrode is aS1, the solder-underlying region area of the second electrode is aS2, the third electrode area is aS3, the fourth electrode area is aS4, the volume of a solder disposed on the solder-underlying region of the first electrode is v1, and the volume of a solder disposed on the solder-underlying region of the second electrode is v2, v1≠v2, and
    each of the values of ah1, v1, aS1, ah2, v2 and aS2 is set so that the height of the first electrode and the second electrode from the surface of the solder-underlying region to the one surface of the optical device is a height in proportion to (ah1+v1/aS1) or (ah2+v2/aS2) after the solder has been melted; and positioning the substrate and the optical device so that the third electrode of the optical device is disposed on the first electrode of the substrate and the fourth electrode of the optical device is disposed on the second electrode of the substrate, melting the solder and soldering the optical device to the substrate;

wherein the surface of the second electrode of the substrate that is in contact with and covered with the solder has a region of material having a nature of increasing the height of solder to higher than the initial height by the melting of the solder, and the area of the solder prepared for the second electrode is larger than the area of the solder-underlying region below the solder, in the preparation step.

11. A mounting method of an optical device according to claim 10, wherein the surface of the substrate in a region in contact with and covered by the solder is formed with at least one member selected from the group consisting of silicon oxide film, silicon nitride film, polyimide type organic polymer resin, chromium (Cr), platinum (Pt), molybdenum (Mo), and tungsten (W).

12. A mounting method of an optical device according to claim 10, wherein the solder is an alloy of gold (Au) and tin (Sn).

13. A mounting method of an optical device according to claim 10, wherein the substrate is a silicon substrate.

14. A mounting method of an optical device according to claim 10, wherein the area of the solder-underlying region of the first electrode is substantially identical with that of the third electrode, and the area of the solder-underlying region of the second electrode is substantially identical with that of the fourth electrode.

15. An optical head device comprising:

a light source for irradiating a disk substrate with light to conduct at least one of writing and reading of information; and a driving circuit for driving the light source to output light, wherein the light source is mounted by a mounting method including the steps:

preparing a substrate in which at least a first electrode and a second electrode are disposed and an optical device in which a third electrode and a fourth electrode are disposed corresponding to the first electrode and the second electrode respectively, in which surfaces for mounting the third electrode and the fourth electrode of the optical device have a first height (ah1) and a second height (ah2) from one surface of the optical device on the side opposite to the surface for mounting the third electrode and the fourth electrode, respectively, where ah1>ah2, each of the first electrode and the second electrode has at least a solder-underlying region and solder on the solder-underlying region, and the solder-underlying region area of the first electrode is aS1, solder-underlying region area of the second electrode is aS2, the third electrode area is aS3, the fourth electrode area is aS4, the volume of a solder disposed on the solder-underlying region of the first electrode is v1, and the volume of a solder disposed on the solder-underlying region of the second electrode is v2, v1≠v2, and each of the values of ah1, ,aS1, ah2, v2 and aS2 is set so that the height of the first electrode and the second electrode from the surface of the solder-underlying region to the one surface of the optical device is a height in proportion with (ah1+v1/aS1) or (ah2+v2/aS2) after melting of the solder, and positioning the substrate and the optical device so that the third electrode of the optical device is disposed on the first electrode of the substrate and the fourth electrode of the optical device is disposed on the second electrode of the substrate, melting the solder and soldering the optical device to the substrate.

16. An optical head device according to claim 15, wherein the light source has a constitution in which plural semiconductor laser devices are mounted on a predetermined substrate, and the plural semiconductor laser devices include, at least one semiconductor laser device having plural electrodes connected electrically to the plural electrodes on the substrate which are formed at positions corresponding to the surface of the substrate and at different levels, and in which the semiconductor laser device is formed by the mounting method of the optical device.

17. An optical head device according to claim 15, wherein the light source includes plural semiconductor laser devices, an optical detector for automatic focusing detection and an optical detector for tracking detection mounted monolithically on a predetermined substrate, and the plural semiconductor laser devices include at least one semiconductor laser device in which at least a first electrode and a second electrode connected electrically to the plural electrodes on the substrate are formed at the height different from each other from one surface of the substrate of the semiconductor laser device, and the semiconductor laser device mounted by a mounting method including the steps;

preparing a substrate in which at least a first electrode and a second electrode are disposed and an optical device in which a third electrode and a fourth electrode are disposed corresponding to the first electrode and the second electrode respectively, in which surfaces for mounting the third electrode and the fourth electrode of the optical device have a first height (ah1) and a second height (ah2) from one surface of the optical device on the side opposite to the surface for mounting the third electrode and the fourth electrode, respectively, where ah1>ah2, each of the first electrode and the second electrode has at least a solder-underlying region and solder on the solder-underlying region, and the solder-underlying region area of the first electrode is aS1, the solder-underlying region area of the second electrode is aS2, the third electrode area is aS3, the fourth electrode area is aS4, the volume of a solder disposed on the solder-underlying region of the first electrode is v1, and the volume of a solder disposed on the solder-underlying region of the second electrode is v2, v1≠v2, and each of the values of ah1, v1, aS1, ah2, v2 and aS2 is set so that the height of the first electrode and the second electrode from the surface of the solder-underlying region to the one surface of the optical device is a height in proportion with (ah1+v1/aS1) or (ah2+v2/aS2) after melting of the solder, and positioning the substrate and the optical device so that the third electrode of the optical device is disposed on the first electrode of the substrate and the fourth electrode of the optical device is disposed on the second electrode of the substrate, melting the solder and soldering the optical device to the substrate, and in which optical paths form the optical source to the disk substrate passing through the light source, a beam splitter and an objective lens is made into a single constitution.

18. An optical head device according to claim 17, wherein the substrate is a semiconductor substrate.

19. An optical head device according to claim 17, wherein the light source includes plural semiconductor laser devices, optical detectors for automatic focusing detection and optical detectors for tracking detection and amplifiers for amplifying signals from both of the detectors mounted monolithically on a predetermined substrate.

20. An optical head device according to claim 17, wherein a material layer having a high thermal conductivity is disposed between the substrate and the semiconductor laser device.

21. An optical head device according to claim 17, wherein a material layer capable of relaxing stresses is disposed between the substrate and the semiconductor laser device.

22. An optical head device according to claim 16, wherein both of (ah1+v1/aS1) and (ah2+vS2/aS2) provide a substantially constant value for the height of the first electrode and the second electrode from the surface of the solder-underlying region to the one surface of the optical device after the solder has been melted.

23. An optical head device according to claim 14, wherein both of (ah1+v1/aS1) and (ah2+vS2/aS2) provide a substantially constant value for the height of the first electrode and the second electrode from the surface of the solder-underlying region to the one surface of the optical device after the solder has been melted.

* * * * *